United States Patent [19]
Wheeler et al.

[11] Patent Number: 4,578,576
[45] Date of Patent: Mar. 25, 1986

[54] BAR CODE READER WITH DIODE FEEDBACK IN AMPLIFIER

[75] Inventors: Jay A. Wheeler, Encinitas, Calif.; James A. Willmore, Eden Prairie, Minn.

[73] Assignee: Opto Systems, Inc., San Diego, Calif.

[21] Appl. No.: 480,384

[22] Filed: Mar. 30, 1983

[51] Int. Cl.[4] .......................... H01J 40/14; H03F 1/36
[52] U.S. Cl. ................................. 250/214 A; 330/110
[58] Field of Search ........................ 235/462–463, 235/466; 250/214 A, 568; 330/293, 107, 109, 110, 294

[56] References Cited

U.S. PATENT DOCUMENTS

| | | | |
|---|---|---|---|
| 3,440,557 | 4/1969 | Sundeen | 330/110 |
| 3,586,991 | 6/1971 | Vosteen | 330/110 |
| 3,949,233 | 4/1976 | Gluck | 235/462 |
| 4,218,613 | 8/1980 | Bletz | 330/110 |
| 4,227,155 | 10/1980 | Lerma | 250/214 A |
| 4,323,774 | 4/1982 | Kopp | 250/214 A |
| 4,349,788 | 9/1982 | Sondermeyer | 330/110 |

OTHER PUBLICATIONS

"Linear Applications" for National Semiconductor Corporation printed in 1973 and particular pp. AN20-6, AN20-7 and the General Description for Operational Amplifiers, LM324, pp. 2-190 through 2-198.

Primary Examiner—David C. Nelms
Assistant Examiner—J. Jon Brophy
Attorney, Agent, or Firm—Schroeder & Siegfried

[57] ABSTRACT

An operational amplifier is disclosed having a phototransistor at its input for reading a bar code wherein the saturation point of an operational amplifier is controlled by a clamping feedback voltage having a positive control controlling the saturation point of the operational amplifier while prohibiting the operational amplifier from reaching its saturation point.

3 Claims, 2 Drawing Figures

BAR CODE READER WITH DIODE FEEDBACK IN AMPLIFIER

DESCRIPTION

Background of the Invention

This invention is directed to a bar code reader and more specifically to an improved circuit in a bar code reader.

Generally a bar code reader reads a row of marks placed upon the object to be read and the signal may be applied to an operational amplifier. In certain applications, in which a broad, dark line passes under the phototransistor, this will generally drive the operational amplifier to a state of saturation and it may stay in the saturation state and not recover before the next mark (or timing mark) is detected. Thus, where mechanism is designed to pick up light or narrow marks in the code system (creating a lot of gain), the problem is to prevent the operational amplifier from saturating where the wide and heavy marks are detected.

The present invention is directed to correcting this state of operation of the operational amplifier. When a zener diode is used in the feedback circuit of the operational amplifier and its operation is moving towards the positive hard saturation condition, it will incounter the zener voltage slightly below saturation, thus keeping the operational amplifier from becoming saturated and resulting in the output pulse being a true representation of the mark width. This is also true of the speed of the mark moving by the read head and rather than have the operational amplifier hang up in a hard saturation, the zener diode voltage prevents the saturation of the operational amplifier.

It is therefore a general object of this invention to provide a circuit for controlling the saturation point of an operational amplifier.

It is yet another object of this invention to provide a feedback circuit for an operational amplifier controlling the level of feedback voltage.

It is still another object of this invention to provide a negative voltage at the input of the operational amplifier to create an operational amplifier clamping voltage.

It is a further object of this invention to provide a signal having a reduced magnitude output and a shortened time base waveform controlling an operational amplifier to avoid saturation.

BRIEF DESCRIPTION OF THE DRAWINGS

A detailed description of one preferred embodiment of the bar code reader is hereafter described with specific reference being made to the drawings in which.

DETAILED DESCRIPTION OF THE DRAWINGS

Figure 1:
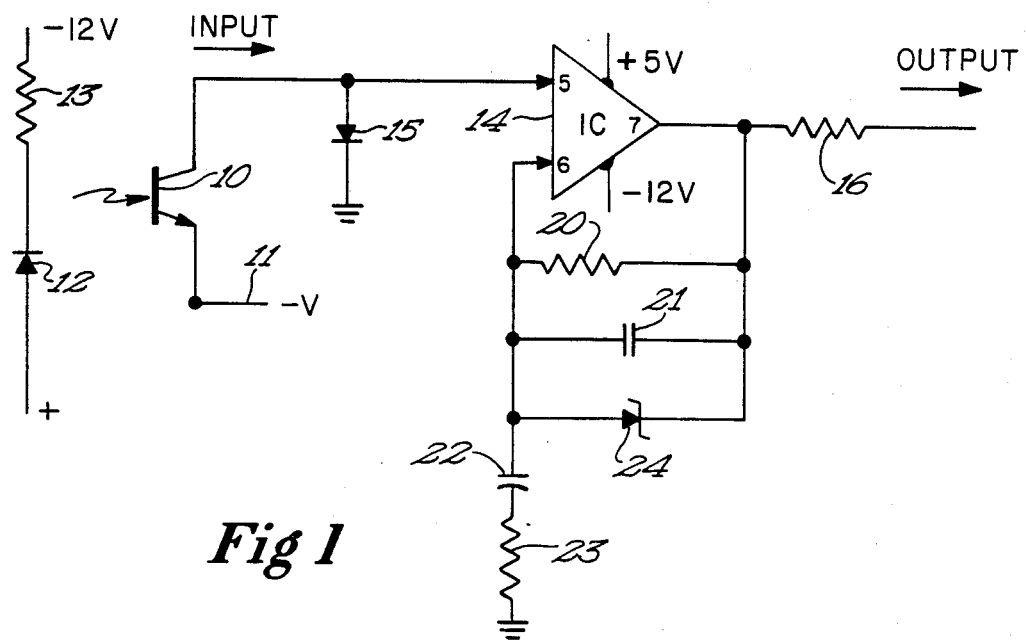
FIG. 1 is a schematic diagram of the invention.

FIG. 1 discloses a circuit for reading and detecting marks, slots, etc., formed in cards or on packages and generally comprises a photoelectric transistor 10 that is connected to a negative voltage source 11. A LED 12 emits light to the surface of a hard or code pattern and is reflected back to phototransistor 10 causing it to conduct. The LED is connected across the 12 volt supply voltage through a 910 ohm resistor 13. The collector of transistor 10 is connected to the negative input of an operational amplifier 14. Operational amplifier 14 may be of the LM-324 group or some other similar operational amplifier, and may be of the type sold by the National Semiconductor Corporation, of Santa Clara, Calif. 95051.

Also connected to the positive input of operational amplifier 14 is a diode 15 that has its other end connected to ground. Diode 15 is of the IN 914 type and holds the input of the operational amplifier to about −0.4 volts when the input signal source goes negative. An isolation resistor 16 is connected to the output of operational amplifier 14 and is 100 ohms in size. The resistor is generally used to prevent the operational amplifier from destroying itself if the output should become shorted.

A feedback circuit is connected between the output pin and the negative going input pin of operational amplifier 14 and is made up of a resistor 20 which generally has a value of 680 ohms that is connected in parallel with a capacitor 21. Capacitor 21 has a value of 330 pf and speeds up the rise and fall time of the output wave form to the input, and between it and the feedback resistor 20, the gain of the operational amplifier is controlled.

Another capacitor 22 provides the power source for the voltage at the negative input through the operational amplifier. The capacitor is a 10 microfarrad capacitor and is connected to a 270 ohm resistance 23 that is connected to ground to complete the circuit. Capacitor 22 and resistance 23 form a time constant that will hold the input to operational amplifier 14 for a finite period of time. Thus, the positive input to the operational amplifier has a bias voltage applied when the output is high, that is, near the +5 volts applied to the operational amplifier, that also has a −12 volts applied. This causes the output of the operational amplifier to go back to the negative −12 volt level.

However, a zener diode 24 is also connected across the parallel combination of resistor 20 and capacitor 21 and is chosen to produce a feedback voltage and operate in the following manner.

Figure 2:
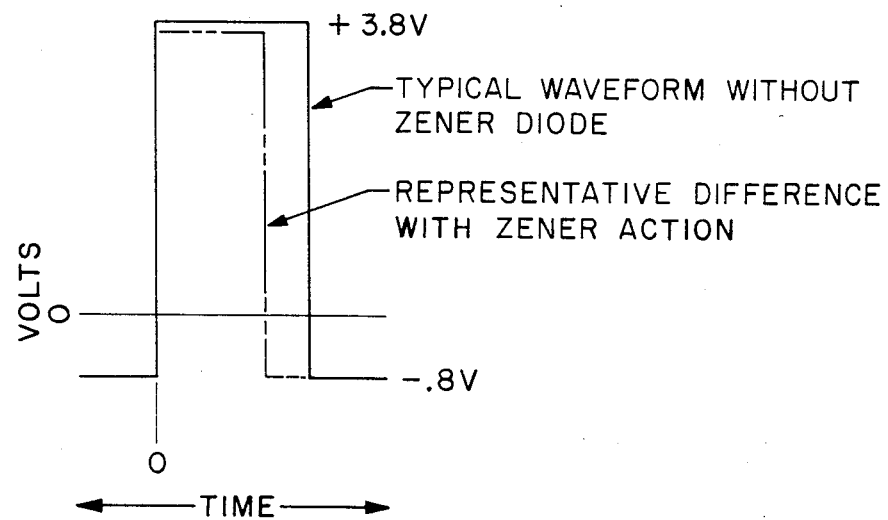
FIG. 2 is a voltage wave shape disclosing the change in shape when using the invention.

If the input to operational amplifier 14 is negative, that is, approximately −0.4 volts with diode 15 clamping at this level, the output of operational amplifier 14 is negative and will attempt to go to the negative supply voltage level which is −12 volts. As the voltage goes negative, it is clamped by the zener diode 24 operation in the forward diode voltage area which is about 0.4 volts, but which has at its input, the clamp reference which is also about −0.4 volts, thus making a total of about −0.8 volts that the output is clamped at. However, when the positive input of the operational amplifier goes positive from the −0.4 volts, the output of the operational amplifier goes positive, and will saturate at some level less than 5 volts. Five volts is the input supply minus the internal circuitry drop which drops the voltage as found in FIG. 2. That is, the voltage as shown is +3.8 volts for the typical wave form without the zener action and less than the +3.8 volts with the zener action. It will also be seen that the wave shape is narrowed or is of a narrower width.

Thus where a broad or dark line is passed under the read head 10, amplifier 14 will saturate hard and may stay up in saturation so long that it will not recover by the time the next mark or timing pulse comes by. While the mechanism is designed to pick up both light or narrow marks without the zener diode, a wide or dark mark produce the saturation which is not desirable.

When the zener action is used, and the operational amplifier is headed towards the positive hard saturation, the zener voltage is slightly below the saturation, thus keeping the operational amplifier from saturation and resulting in the output pulse being a true representation of the mark width and also speed of the mark being detected.

As stated previously, different operational amplifiers may be used and the zener diode chosen to bring the proper voltage characteristic to work with the operational amplifier.

In considering the invention, it should be remembered that the present disclosure is illustrative only and the scope of the invention should be determined by the appended claims.

What is claimed is:

1. In a circuit for controlling the point of saturation of an operational amplifier, said circuit comprising:
   (a) an operational amplifier having positive and negative input terminals, an output terminal and connections for receiving a positive and negative operating voltage;
   (b) a diode connected to ground and said positive terminal of said operational amplifier said diode conducting current to ground;
   (c) a feedback circuit connected between the output of said operational amplifier and said negative input terminal;
   (d) a time constant circuit connected between ground and said negative input terminal;
   (e) a power source having a positive and negative voltage connection connected to said operational amplifier;
   (f) a zener diode connected in parallel with said feedback circuit to control the saturation of said operational amplifier, said zener establishing the saturation point below normal saturation point of said operational amplifier;
   (g) a phototransistor reading indica passing thereby connected to the positive input of said operational amplifier;
   (h) and a light source flooding said indica to be read by said phototransistor.

2. The structure set forth in claim 1 wherein said feedback circuit and said time constant circuit are connected in parallel to said negative input terminal of said operational amplifier to create an operational amplifier output clamping voltage.

3. The structure set forth in claim 1 wherein said zener diode causes the output terminal of said operational amplifier to have a voltage wave form that has its magnitude lessened and the time base of said voltage wave form is shortened when the negative input voltage of the operational amplifier goes positive.

* * * * *

UNITED STATES PATENT AND TRADEMARK OFFICE
CERTIFICATE OF CORRECTION

PATENT NO. : 4,578,576
DATED : March 25, 1986
INVENTOR(S) : Jay A. Wheeler
James A. Willmore It is certified that error appears in the above-identified patent and that said Letters Patent are hereby corrected as shown below:

Column 1, Line 26 the word "incounter" should be --encounter--.
Line 67 the word "negative" should be --positive--.

Column 2, Line 47 the word "operation" should be --operating--.
Line 68 the word "produce" should be --produces--.

Signed and Sealed this

Nineteenth Day of August 1986

[SEAL]

Attest:

DONALD J. QUIGG

Attesting Officer

Commissioner of Patents and Trademarks